United States Patent [19]

Ogura et al.

[11] Patent Number: 4,630,088
[45] Date of Patent: Dec. 16, 1986

[54] MOS DYNAMIC RAM

[75] Inventors: Mitsugi Ogura; Masaki Momodomi, both of Yokohama, Japan

[73] Assignee: Kabushiki Kaisha Toshiba, Kawasaki, Japan

[21] Appl. No.: 719,450

[22] Filed: Apr. 3, 1985

[30] Foreign Application Priority Data

Sep. 11, 1984 [JP] Japan .............................. 59-190002

[51] Int. Cl.[4] ..................... H01L 29/78; H01L 27/02; H01L 29/06; G11C 11/24
[52] U.S. Cl. .................................. 357/23.6; 357/23.4; 357/41; 357/55; 365/149
[58] Field of Search ........................ 357/23.4, 23.6, 41, 357/55, 56; 365/149

[56] References Cited

U.S. PATENT DOCUMENTS

| | | | |
|---|---|---|---|
| 4,003,036 | 1/1977 | Jenne | 357/23.4 |
| 4,227,297 | 10/1980 | Angerstein | 357/23.6 |
| 4,353,082 | 10/1982 | Chatterjee | 357/23.6 |
| 4,462,040 | 7/1984 | Ho et al. | 357/23.6 |
| 4,491,936 | 1/1985 | Eaton et al. | 365/149 |

Primary Examiner—Gene M. Munson
Attorney, Agent, or Firm—Oblon, Fisher, Spivak, McClelland, & Maier

[57] ABSTRACT

A MOS dynamic RAM consists of integrated memory cells each having a MOSFET and a MOS capacitor. The MOS dynamic RAM comprises a semiconductor substrate of a first conductivity type on which periodic projections and recesses are formed, a source region of a second conductivity type formed in the upper surface of each projection, a drain region of the second conductivity type formed in a bottom portion of each projection, a channel region of the first conductivity type sandwiched between the source and drain regions, a gate insulating film formed on a side wall of each projection between the source and drain regions, a gate electrode formed on the gate insulating film, a first insulating film formed on the source region, and a first electrode of the MOS capacitor formed on the first insulating film. The MOSFET is constituted by the source, drain and channel regions, the gate insulating film and the gate electrode. The MOS capacitor is constituted by the source region, the first insulating film and the first electrode, and the source region serves as the second electrode thereof. The gate electrodes serve as word lines, and the first electrodes of MOS capacitor serve as bit lines.

27 Claims, 31 Drawing Figures

| "0"-WRITING | PRECHARGE | "0"-READING |
|---|---|---|
| 0V / NS(5V) / 8V / 5V | 5V / NS(9V) / 0V / 5V | $(5V-5V\times\frac{CS}{CB+CS})$ (9-5V) / NS(5V) / 8V / 5V |

| "1"-WRITING | PRECHARGE | "1"-READING |
|---|---|---|
| 5V / NS(5V) / 8V / 5V | 5V / NS(5V) / 0V / 5V | (5V) / NS(5V) / 8V / 5V |

F I G. 4A
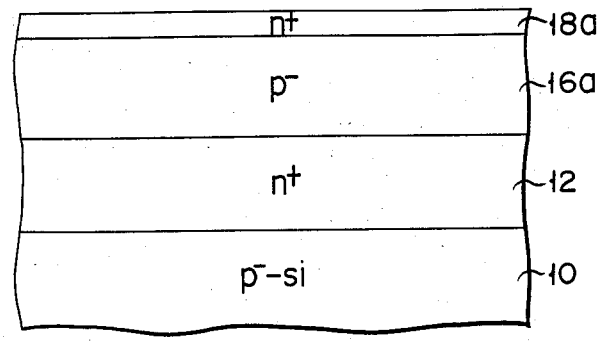
F I G. 4B
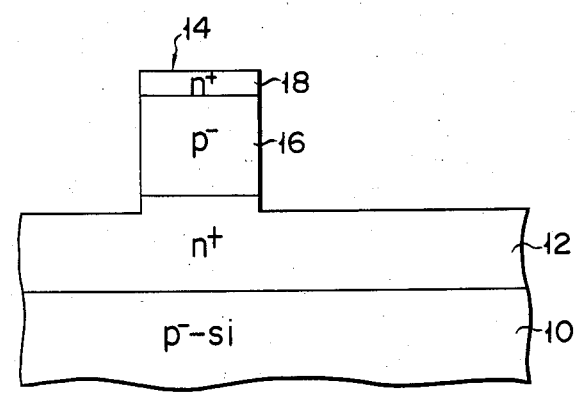
F I G. 4C
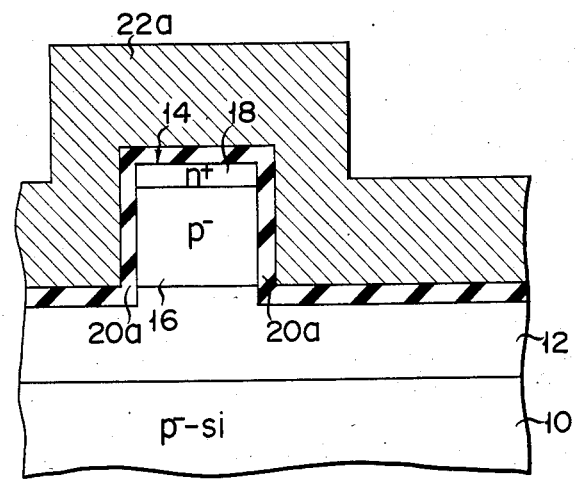

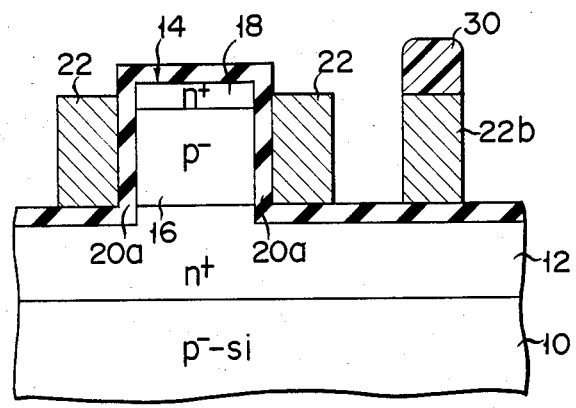
F I G. 4D
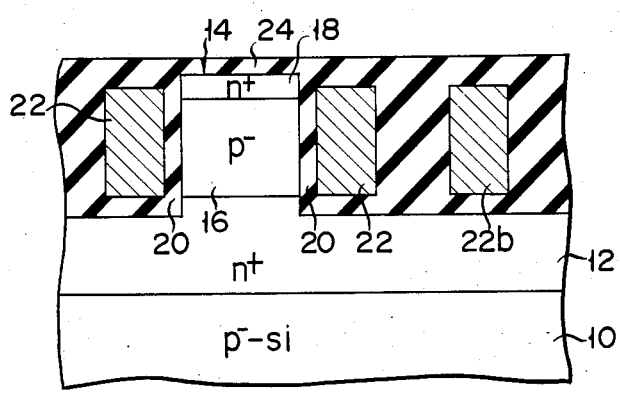
F I G. 4E
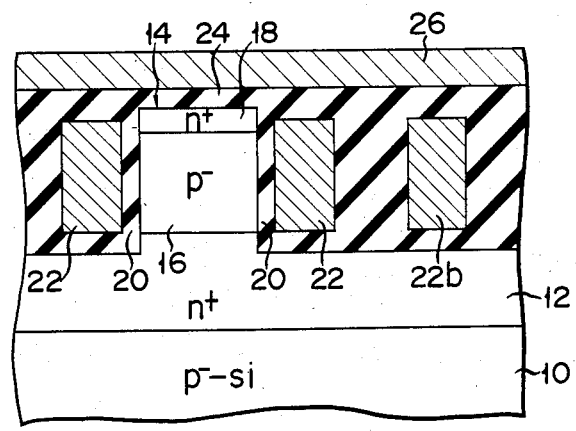
F I G. 4F

MOS DYNAMIC RAM

BACKGROUND OF THE INVENTION

The present invention relates to a MOS dynamic RAM Cell consisting of a single MOSFET and a single MOS capacitor.

Recent trends in semiconductor memory devices are higher integration and larger capacity. Particularly, MOS dynamic RAMs having memory cells each consisting of a MOSFET and a MOS capacitor have achieved the highest integration because of the type of memory cell. A 256-Kbit MOS dynamic RAM is already commercially available, and a 1-Mbit RAM has been developed in a laboratory. A MOS dynamic RAM in which a MOSFET is arranged vertically with respect to a semiconductor substrate and a pn junction between the semiconductor substrate and a drain region of the MOSFET is used as a capacitor is disclosed in Japanese Patent Publication (KOKOKU) No. 58-34946. However, in this device, a soft error due to α-rays easily occurs because the capacitor is formed in the semiconductor substrate. In other words, α-particles radiated from radioactive elements such a U, Th and the like in a package material generate electron-hole pairs in the semiconductor substrate. Electrons undesirably reach a pn junction which constitutes the capacitor, thus erasing storage data. In an integrated chip, a contact area between the bit line and the channel region is required for each memory cell. In addition, a field region for element isolation is also required for each memory cell.

SUMMARY OF THE INVENTION

It is an object of the present invention to provide a MOS dynamic RAM in which soft errors due to radiation are prevented.

It is another object of the present invention to provide a highly integrated and large-capacity MOS dynamic RAM.

A semiconductor memory device according to the present invention is characterized in that integrated memory cells each comprises a MOSFET whose source and drain regions are formed vertically by utilizing side walls of a recess and a projection formed on a semiconductor substrate, and a MOS capacitor including the source region and a capacitor electrode formed to overlap the source region of the MOSFET; and in that a gate electrode of the MOSFET serves as a word line and the capacitor electrode serves as a bit line.

According to the present invention, since the capacitor electrode instead of the drain region is used as a bit line, the drain region formed in the bottom portion of the projection can be fixed at a desired potential, e.g., Vcc (+5 V) during operation. Since all the memory cells or those of each row or column can commonly use the drain region, voltage application is easy. Since the drain region can absorb electrons generated by α-rays, a soft error in a memory cell can be eliminated. Furthermore, since the capacitor electrode serves as the bit line, a soft error occurring in a bit line mode can be limited to those occurring in portions of sense amplifiers connected to the substrate. Thus, a substrate area in which soft errors occur can be reduced.

According to the present invention, MOS capacitors are stacked on corresponding MOSFETs. A bit line potential is applied to the second electrode of each MOS capacitor constituting the uppermost cell layer. Therefore, the second electrodes may be continuously formed along the row direction so as to be used as the bit lines. Alternatively, the Al wiring layer formed on the second electrodes may be used as the bit lines. With the former structure, contact holes for the bit lines for the memory cells are not required, thus facilitating high integration. Since the number of contact holes is reduced, the number of masks for forming contact holes can also be reduced. With the latter structure, contact holes can be formed in a region of the MOSFET and the MOS capacitor. Therefore, the MOS dynamic RAM according to the present invention can achieved high integration and a large capacity in comparison with conventional MOS dynamic RAMs.

Unlike conventional MOS dynamic RAMs, a field region for isolation is not required, thereby further facilitating high integration.

As will be described later, when MOSFETs are formed to surround respective projections, a large channel width W can be easily obtained. Therefore, a channel length L need not be shortened to provide a large conductance and a gate insulating film thickness $t_{ox}$ need not be reduced. For this reason, variation in a threshold value due to hot electrons can be reduced in comparison to MOSFETs formed on a planar surface, thus improving the reliability of the dRAM.

The source region independently formed in an upper surface of the projection for each memory cell is isolated by a high impurity concentration layer, and a fixed potential is applied to this high impurity concentration layer, thus obtaining a highly reliable dRAM. Particularly, when the drain regions of MOSFETs are formed by a high impurity concentration layer formed on the overall surface of the substrate and common to all the memory cells, and the capacitor electrodes are used as bit lines, formation of the high impurity concentration layer to which a fixed potential is applied is important for preventing floating of the substrate regions of the MOSFETs.

When two source regions are formed in upper portions of at least two opposing projections and a first electrode of a capacitor is formed so as to connected these source regions, the memory cell may have a large capacity and require less area. Furthermore, when the groove is formed in a V-shape, it may be formed by wet taper etching which is well known, resulting in an easy manufacturing process.

BRIEF DESCRIPTION OF THE DRAWINGS

Other objects and advantages will be apparent from the following description taken in conjunction with the accompanying drawngs in which:

FIGS. 4A to 4F are sectional views for explaining a manufacturing method of the MOS dynamic RAM of FIG. 1;

DETAILED DESCRIPTION OF THE PREFERRED EMBODIMENTS

A first embodiment of a MOS dynamic RAM according to the present invention will be described with reference to FIGS. 1 and 2.

Figure 1:
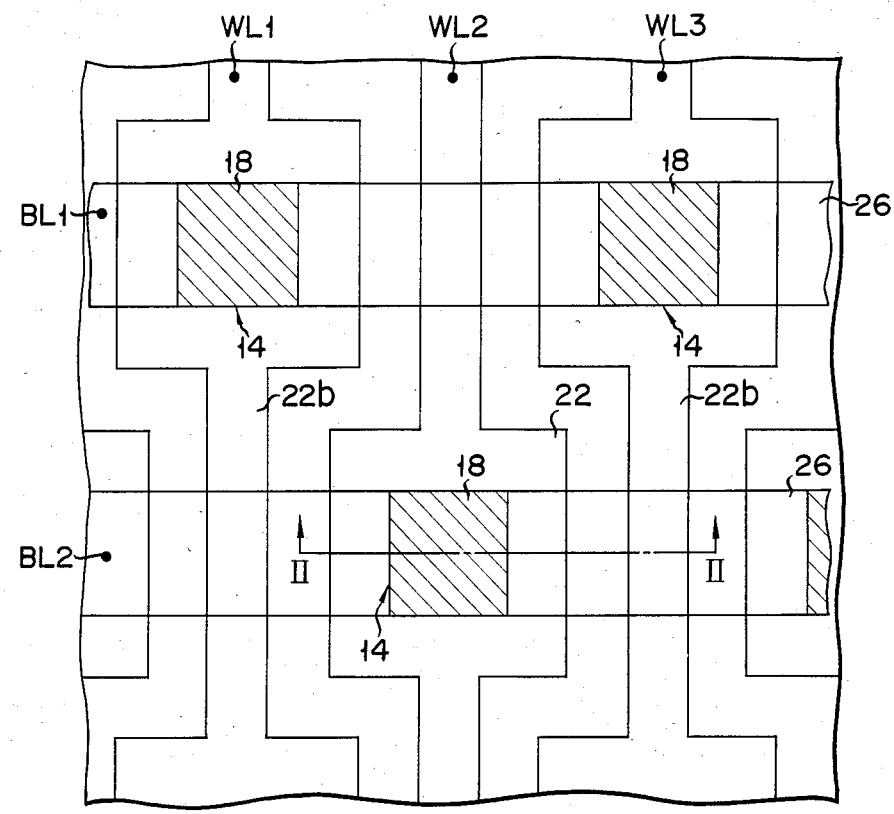
FIG. 1 is a plan view of a MOS dynamic RAM according to a first embodiment of the present invention.
Figure 2:
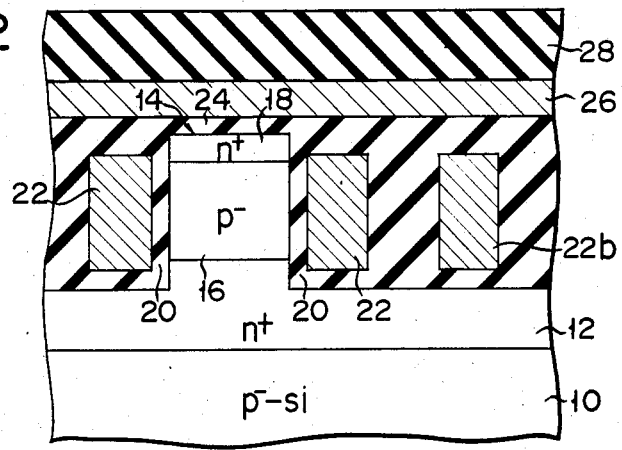
FIG. 2 is a sectional view taken along a line II—II of FIG. 1.

Hatched portions of FIG. 1 represent MOS capacitor regions of respective memory cells. As shown in FIG. 2, an $n^+$-type layer 12 which serves as a common drain region of MOSFETs of all the memory cells is formed in a $p^-$-type Si substrate 10. The memory cell regions are formed in corresponding projections 14. A $p^-$-type layer 16 and an $n^+$-type layer 18 are, respectively, a source region and a channel region which are independently provided for each memory cell. First polycrystalline silicon films 22 as gate electrodes are formed on the sidewalls of projections 14 with gate insulating films 20 interposed between the first polycrystalline silicon films 22 and the sidewalls, so as to surround the corresponding projections 14. The first polycrystalline silicon films 22 receive same potential. Each first polycrystalline silicon film 22 serves as the gate electrode at a portion surrounding the projection 14. Also, as apparent from FIG. 1, each first polycrystalline silicon film 22 is commonly used as a word line WL (WL1, WL2, . . . ) for the memory cells aligned along the column direction. Note that reference numeral 22b denotes wiring layers which connect the gate electrodes of the respective memory cell regions. Each MOS capacitor comprises the $n^+$-type layer 12 which serves as both the source region of the MOSFET and a first electrode of the MOS capacitor, and a second polycrystalline silicon film 26 which is formed thereon through an insulating film 24 and serves as a second electrode of the MOS capacitor. Also, as apparent from FIG. 1, each second polycrystalline silicon film 26 is commonly used as a bit line BL (BL1, BL2, . . . ) for the memory cells aligned along the row direction. An insulating interlayer 28 is formed on the second polycrystalline silicon film 26, and desired metal wiring layers (not shown) are formed thereon.

Figures 3A, 3B, 3C:
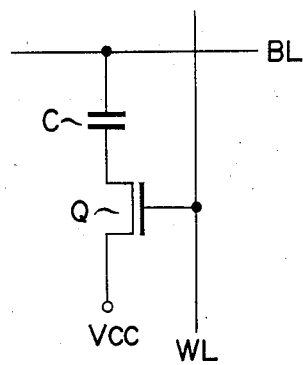
FIG. 3A shows an equivalent circuit of the MOS dynamic RAM shown in FIG. 1.
FIGS. 3B and 3C are representations for explaining an operation of the MOS dynamic RAM of FIG. 1.

FIG. 3A shows an equivalent circuit of the memory cell. The drain region of a MOSFET Q which is the $n^+$-type layer 12 common to all bits, as described with reference to FIG. 2, is connected to a power supply voltage Vcc (e.g., 5 V). A Vcc line is, therefore, in contact with the $n^+$-type layer 12 in the periphery of the chip. As described above, the gate electrode and word line WL of the MOSFET Q is formed of the first polycrystalline silicon film 22, and the second electrode and bit line BL of a MOS capacitor C is formed of the second polycrystalline silicon film 26.

FIGS. 3B and 3C show operating voltages of the memory cell in writing, precharge and reading modes. Assume that the power supply voltage Vcc is a positive voltage, e.g., +5 V and a substrate potential is e.g. −3 V. As shown in FIG. 3B, in a "0"-writing mode, a voltage of 8 V is applied to the word line WL of the memory cell so as to turn on the MOSFET and to set the bit line BL at 0 V. Thus, a voltage of about 5 V appears at a node Ns, thereby performing the writing operation. When the word line WL is at 0 V and the power supply voltage Vcc is 5 V, a potential of the node Ns is increased to about 9 V for a precharge mode. In the reading mode of the memory cell, a voltage of 8 V is applied to the word line WL. Thus, a potential of the bit line BL is $\{5 - 5 \times (9-5) \times Cs\}/(CB+CS)$ [V], where CS is a capacitance of the MOS capacitor, and CB is a capacitance of the bit line BL. Therefore, a potential of the bit line BL may be compared with a reference potential by a sense amplifier.

Similarly, as shown in FIG. 3C, in a "1+-writing mode, the writing operation is performed such that the word line WL=8 V, the bit line BL=5 V and the node Ns=5 V, as shown in FIG. 3C. In the precharge mode, the word line WL=0 V, the bit line BL=5 V and the node Ns=5 V. Therefore, when the word line WL=8 V, a voltage of 5 V appears on the bit line 5 V, thereby performing the "1"-writing operation.

Manufacturing steps of the MOS dynamic RAM according to the present invention will be described hereinafter with reference to FIGS. 4A to 4F. FIGS. 4A to 4F are sectional views corresponding to that shown in FIG. 2.

As shown in FIG. 4A, phosphorus is diffused in a high concentration in a prospective memory cell portion of a $p^-$-type Si substrate 10 after a photo engraving process (PEP) so as to form an $n^+$-type layer 12 as a common drain region for all the memory cells. A $p^-$-type layer 16a containing boron in a low concentration is epitaxially grown on the resultant structure. An impurity concentration of the $p^-$-type layer 16a is improtant for determining a threshold voltage of the MOSFET, and is set at, e.g., $1 \times 10^{17}/cm^3$. An $n^+$-type layer 18a in which arsenic is diffused in a high concentration is formed on the prospective memory cell portions by the PEP. A mask is formed on a resultant structure or a wafer comprising such a pnpn structure by PEP. Using this mask, the wafer except for prospective MOSFET regions is selectively etched to a depth of the n+-type layer 12, thereby forming projections 14 having a predetermined periodical arrangement, as shown in FIG. 4B. The n+-type layer 18 remaining on each projection 14 serves as a source region of the MOSFET and a first electrode of the MOS capacitor for each memory cell, and the p--type layer 16 serves as a channel region. Thereafter, as shown in FIG. 4C, a thermal oxide film 20a to be a gate insulating film 20 of the MOSFETs is formed on the resultant structure, and a first polycrystalline silicon film 22a is epitaxially grown thereon. The gate insulating film 20 need not be thinly formed because of a sufficient channel width of the MOSFET. Therefore, a thickness of the film 20 is, e.g., 50 nm (500 Å). The first polycrystalline silicon film 22a is processed so as to form gate electrodes and word lines 22 which are common to the memory cells aligned along the column direction. In this case, when the first polycrystalline silicon film 22a is selectively etched by a distance corresponding to a thickness thereof by anisotropic dry etching, e.g., RIE, the gate electrodes 22 can be formed in a self-alignment manner. However, a mask 30 shown in FIG. 4D must be formed on wiring layers 22b which connect the gate electrodes of the respective memory cell regions. Alternatively, a mask having the same height as that of the projection 14 is formed on a region between the two adjacent word lines, and thereafter, the first polycrystalline silicon film 22 may be buried in a groove between the projection 14 and the mask. Thereafter, the thermal oxide film 20a on the n+-type layer 18 is removed, and in order to obtain a desired capacitance, a thermal oxide film of, e.g., 15 nm (150 Å) thickness as an insulating film 24 is formed on the resultant structure, as shown in FIG. 4E. At this time, surfaces of the first polycrystalline silicon films 22 and 22b are also oxidized, and the oxidized films serve as insulating interlayers. Thereafter, as shown in FIG. 4F, a second polycrystalline silicon film is deposited on the resultant structure, and is selectively etched by the PEP so as to form second electrodes of the MOS capacitor and bit lines 26.

The dRAM according to this embodiment has the following advantages. The drain region is formed by a shallow n+-type layer, the gate electrodes and word lines are formed by the first polycrystalline silicon films, and the second electrodes and bit lines of the MOS capacitors are formed by the second polycrystalline silicon films. For this reason, a contact hole for each memory cell is not needed. Therefore, the memory cells can be highly integrated. Since the MOS capacitors are stacked on the corresponding MOSFET along the vertical direction, the memory cells can be more highly integrated.

In the memory cells according to this embodiment, current channels of the MOSFETs are formed on the side walls of the projections 14 of the semiconductor substrate 10 along the vertical direction. In addition, the MOS capacitors are stacked on the corresponding MOSFETs. Furthermore, each MOS capacitor is separated from the substrate 10 by a pn junction barrier for the MOSFET. Therefore, the MOS dynamic RAM of this embodiment is resistant to soft errors.

Since each MOSFET utilizes all of the surrounding portion of the projection 14 as the channel region, a channel width can be enlarged, and the insulating film need not be formed so thinly. Therefore, a variation in a threshold voltage due to hot electrons can be reduced.

Although the MOS dynamic RAM of this embodiment comprises a specific memory cell structure, the manufacturing method thereof does not require a sophisticated technique. Particularly, since the memory cell regions do not require contact holes, highly integrated dRAMs can be manufactured at high yield.

The present invention is not limited to the above embodiment, and various changes and modifications can be made.

Figure 5:
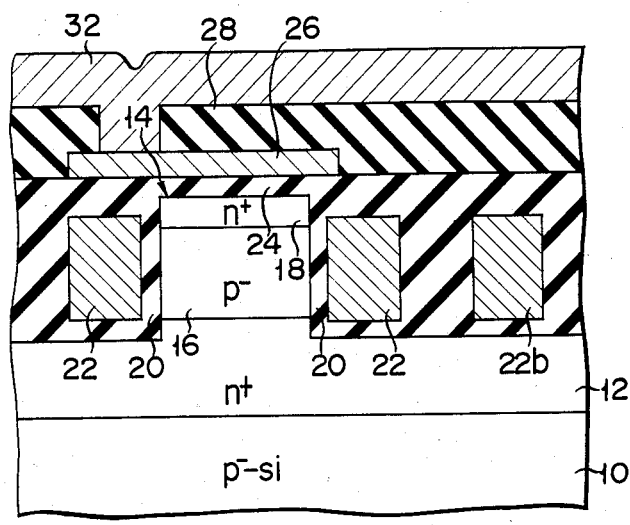
FIGS. 5 and 6 are sectional views of MOS dynamic RAMs according to second and third embodiments of the present invention, respectively.

A second embodiment of a MOS dynamic RAM according to the present invention will be described hereinafter with reference to FIG. 5. In the second embodiment, a second electrode of each MOS capacitor constituted by a second polycrystalline silicon film 26 is independently formed for each memory cell. The second electrodes 26 are respectively connected to Al wiring layers 32 provided along the row direction through an insulating interlayer 28. The Al wiring layers 32 constitute bit lines. In this case, since contact holes between the Al wiring layers 32 and the second polycrystalline silicon films 26 are formed on the respective memory cells, an additional element area is not required. Therefore, integration and reliability of the MOS dynamic RAM is not reduced. Since the other structures are the same as those of the first embodiment, the same reference numerals denote the same parts and a detailed description thereof is omitted.

Figure 6:
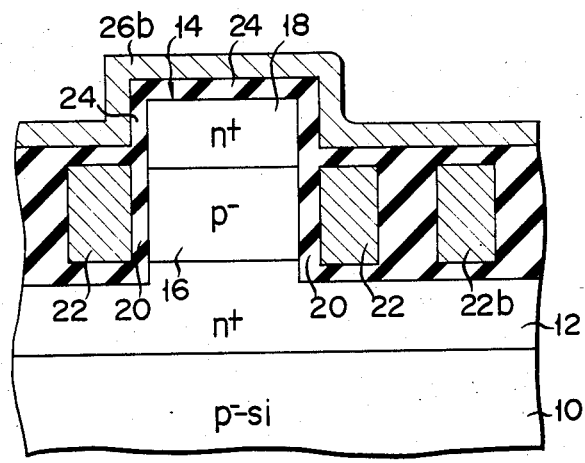

A third embodiment of a MOS dynamic RAM according to the present invention will be described with reference to FIG. 6. In this embodiment, an n+-type layer 18 as a source region of each MOSFET is formed to be sufficiently thick so that not only an upper surface but also a side surface is utilized as an electrode of the MOS capacitor. A second electrode 26b of each MOS capacitor opposes the side surface of the n+-type layer 18 through the insulating film 24. Since the other structures are the same as those of the first embodiment, the same reference numerals denote the same parts and a detailed description thereof is omitted. With this structure, the capacity of each MOS capacitor can be increased.

Figure 7:
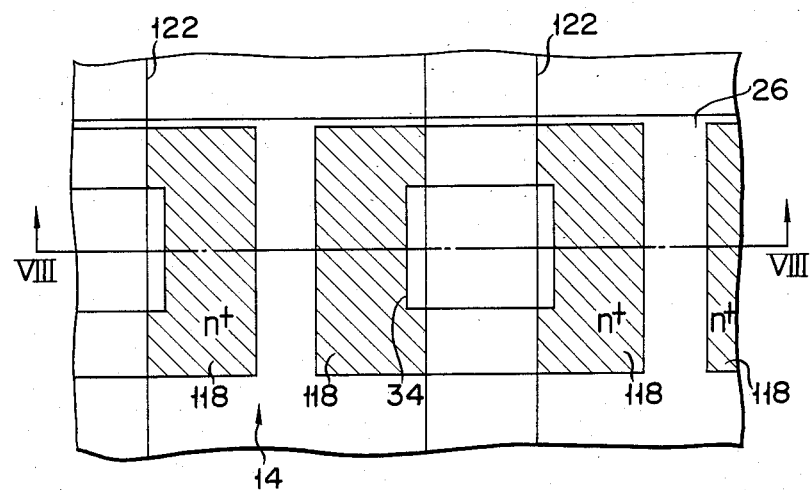
FIG. 7 is a plan view of a MOS dynamic RAM according to a fourth embodiment of the present invention.
Figure 8:
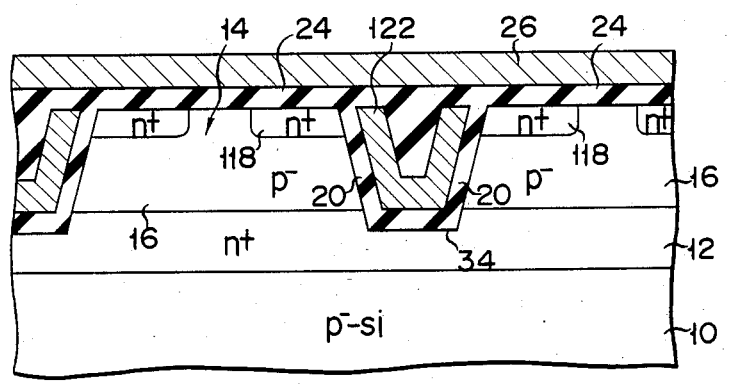
FIG. 8 is a sectional view taken along a line VIII—VIII of FIG. 7.

A fourth embodiment of a MOS dynamic RAM according to the present invention will be described with reference to FIGS. 7 and 8. In the above embodiments, the memory cells are formed in the projections formed on the surface of the substrate. However, as in this embodiment, memory cells can be formed in recesses. In FIGS. 7 and 8, the same reference numerals denote the same parts corresponding to the above embodiments. The structure shown in FIGS. 7 and 8 is obtained in the following manner. An n+-type layer 12 as a common drain region for all bits is formed by diffusion in a p--type Si substrate 10, and a p--type layer 16 is epitaxially grown thereon. N+-type layers 118 for source regions of the MOSFETs are formed in memory cell regions. The resultant structure is selectively etched to a depth of the n+-type layer 12 so as to form recesses 34 in the respective memory cell regions. A first polycrystalline silicon film 122 as a gate electrode is formed on a side wall of each recess 34 through a gate insulating film 20. In this case, the gate electrodes 122 are aligned along the column direction so as to be used as word lines in the same manner as described above. The n+-type layer 118 in each projection 14 adjacent to each recess 34 is used as a first electrode of the MOS capacitor, and a second electrode and bit line constituted by a second polycrystalline silicon film 26 is formed thereon through an insulating film 24. In this embodiment, hatched portions in FIG. 7 are capacitor regions.

In this embodiment utilizing the side walls of the recesses 34, since current channels of the MOSFET are formed along the vertical direction and the MOS capacitors are formed on the MOSFETs in the same manner as in the above embodiments, the same effect as that thereof can be obtained.

Figure 9:
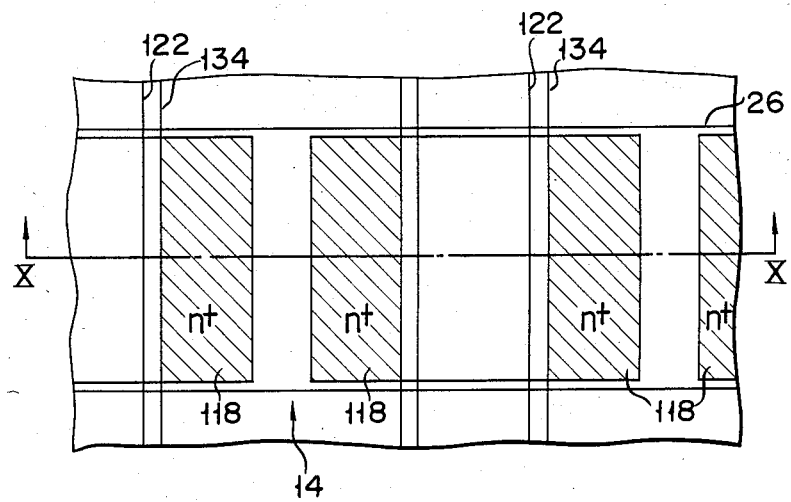
FIG. 9 is a plan view of a MOS dynamic RAM according to a fifth embodiment of the present invention.
Figure 10:
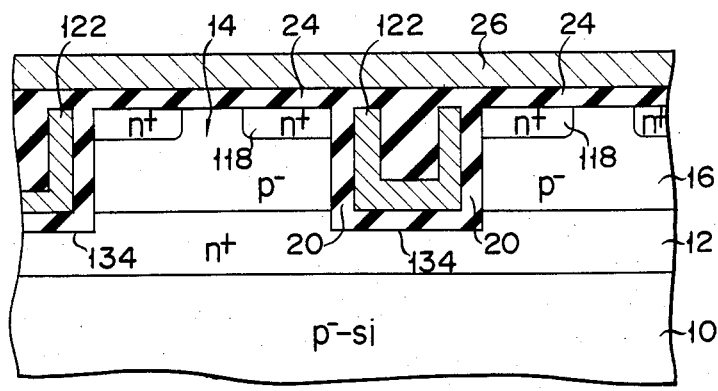
FIG. 10 is a sectional view taken along a line X—X of FIG. 9.

A fifth embodiment of the present invention will be described with reference to FIGS. 9 and 10. In this embodiment, stripe recesses 134 are formed along the column direction, as shown in FIG. 9. Gate electrodes 122 are buried in the corresponding recesses 134 along the side walls thereof. Therefore, one gate electrode 122 is commonly used for a plurality of MOS transistors formed in the single projection 14. Note that the gate electrodes 122 may be buried by an etch-back method in which, after forming the first polycrystalline silicon film on the overall surface, a surface of the resultant structure is flattened by a photoresist and the overall surface is etched back. Since the other structures are the same as those in the fourth embodiment, the same reference numerals denote the same parts and a detailed description thereof is omitted.

Figure 11:
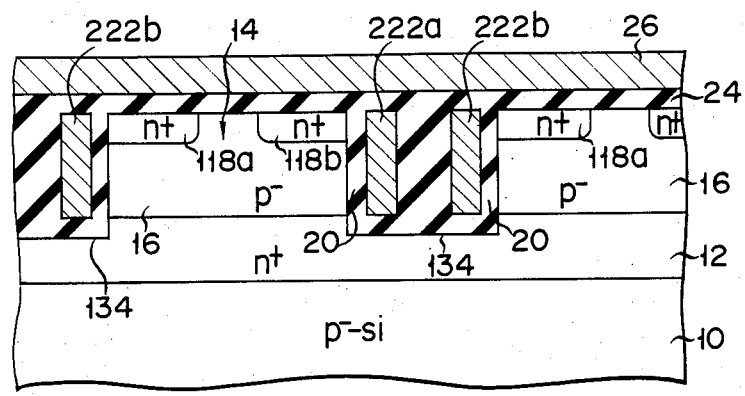
FIG. 11 is a plan view of a MOS dynamic RAM according to a sixth embodiment of the present invention.

A sixth embodiment of a MOS dynamic RAM according to the present invention will be described with reference to FIG. 11. In this embodiment, different gate electrodes 222a and 222b are respectively formed on both side surfaces of each stripe recess 134 along the column direction. N+-type layers 118a and 118b are provided for different memory cells. The gate electrodes 222a and 222b may be formed in a manner such that, for example, a polycrystalline silicon film is etched by an overall anisotropic etching technique in the same manner described in FIGS. 4C and 4D. Since the other structures are the same as those of the fifth embodiment, the same reference numerals denote the same parts and a detailed description thereof is omitted. According to the sixth embodiment, the MOS dynamic RAM can be more highly integrated than those of the above embodiments.

Figure 13:
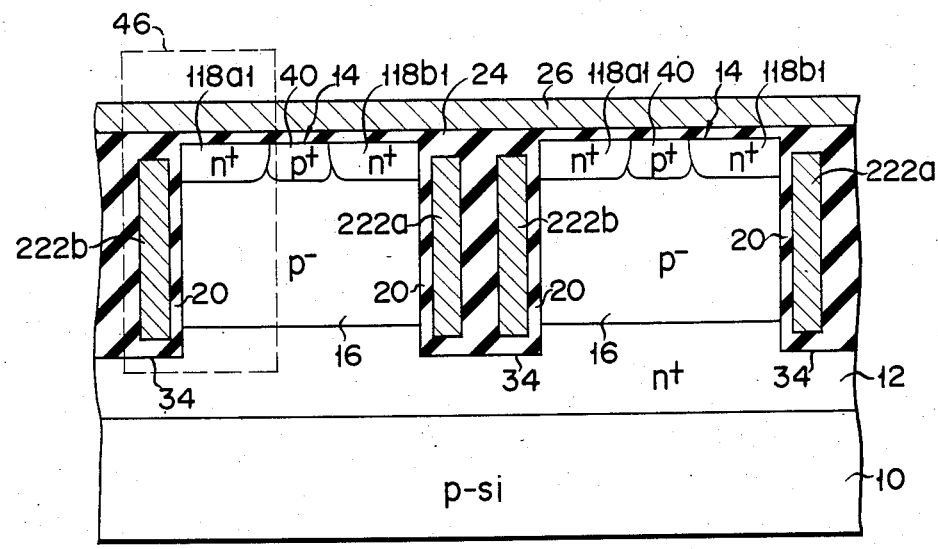
FIG. 13 is a sectional view taken along a line XIII—XIII of FIG. 12.
Figure 12:
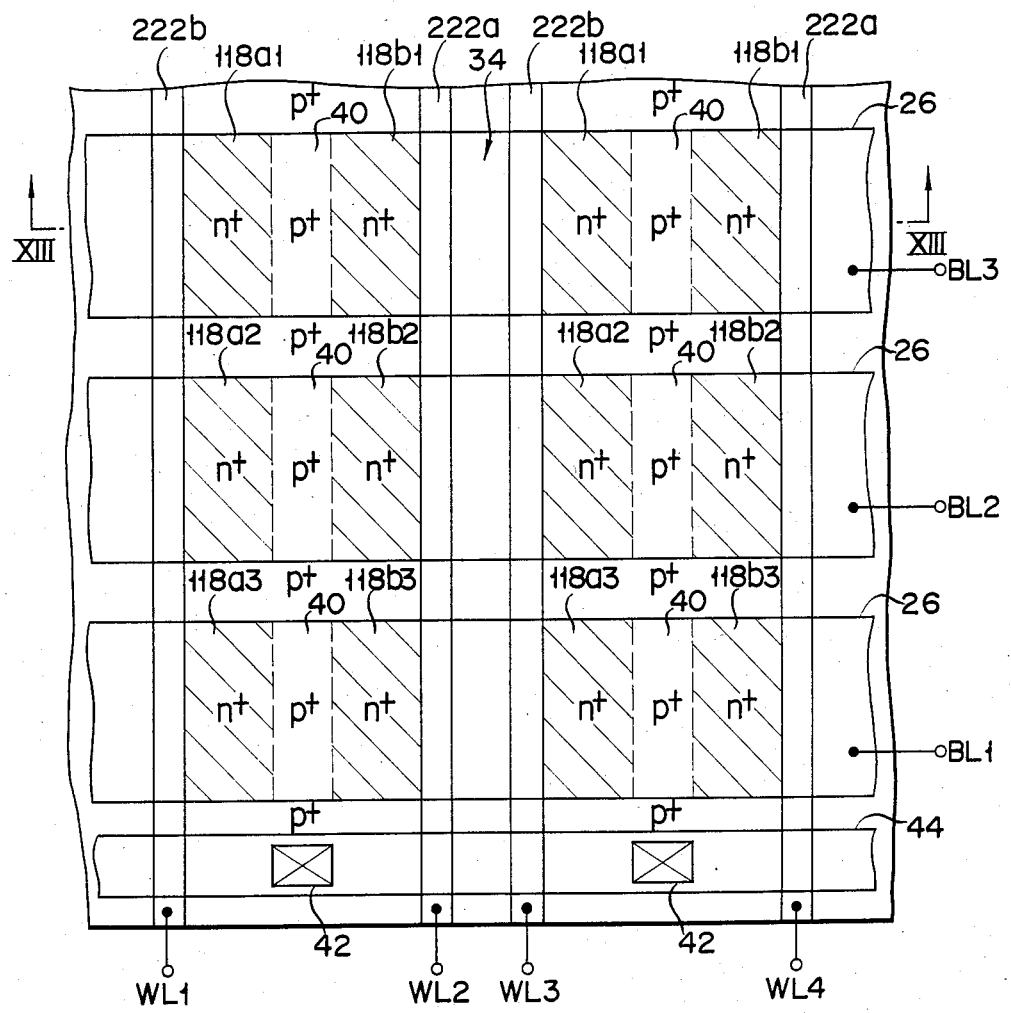
FIG. 12 is a plan view of a MOS dynamic RAM according to a seventh embodiment of the present invention.
Figure 14:
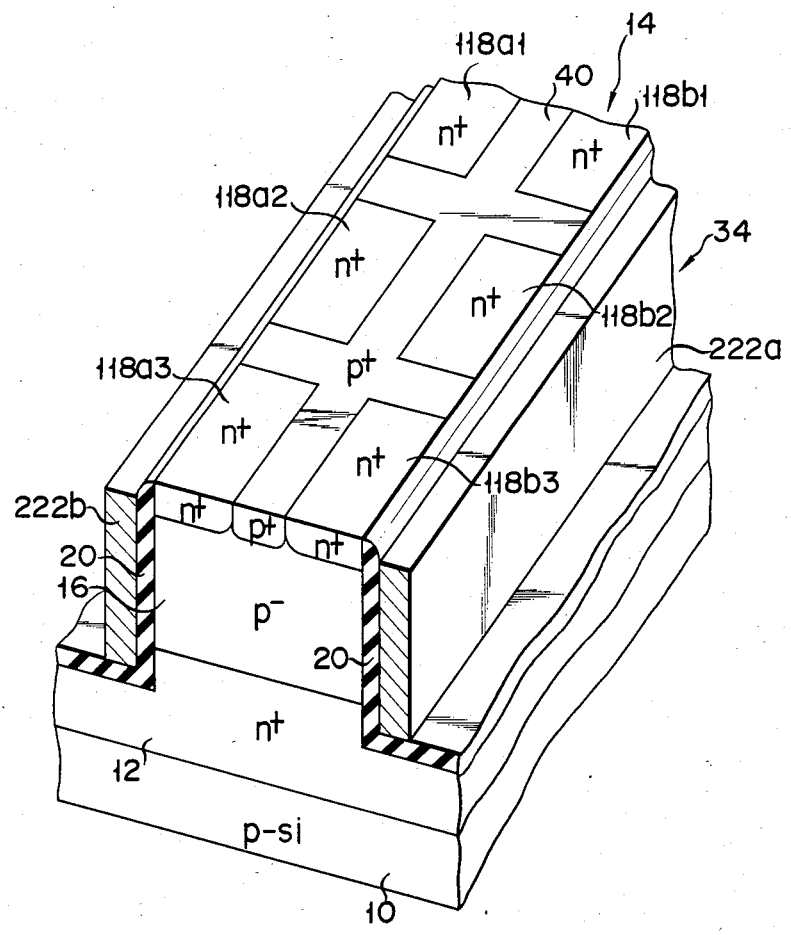
FIG. 14 is a partial perspective view of the MOS dynamic RAM of FIG. 12.

A seventh embodiment of a MOS dynamic RAM according to the present invention will be described with reference to FIGS. 12 to 14. As shown in FIG. 13, a wafer is used in which an n+-type layer 12 as a common drain region of MOSFETs for all memory cells is formed on a p−-type Si substrate 10, and a p−-type layer 16 is epitaxially grown thereon. The wafer is etched by anisotropic etching such as RIE so as to form grooves which reach the n+-type layer 12, thereby forming a plurality of stripe projections 14. In addition, gate electrodes 222a and 222b are continuously formed on side walls of each projection 14 through a gate insulating film 20. The gate electrodes 222a and 222b are formed of first polycrystaline silicon films on two side surfaces of each projection 14 to serve as different word lines (e.g., WL1, and WL2, WL3 and WL4, . . . ), as apparent from FIG. 13. N+-type layers 118a1, 118a2, 118a3, 118b1, 118b2 and 118b3 as respective source regions of the memory cells are dispersively formed in the upper surfaces of the corresponding projections 14 so as to be spaced apart from each other and extend along the two sides thereof. The n+-type layers 118a1, 118a2, 118a3, 118b1, 118b2 and 118b3 as the source regions of the MOSFETs also serve as first electrodes of the MOS capacitors, and second electrodes 26 are formed thereon through a capacitor insulating film 24. The second electrodes 26 are formed of second polycrystalline silicon films, and constitute a plurality of bit lines BL1, BL2, BL3, . . . aligned along a direction perpendicular to the gate electrodes 222a and 222b. A region 46 indicated by a dotted line in FIG. 13 constitutes one memory cell. Hatched portions of FIG. 12 correspond to the MOS capacitor regions.

A p+-type layer 40 for isolating the source regions of the respective memory cells is formed between said source regions in the p−-type layer 16 of each projection 14. The p+-type layers 40 of the respective projections 14 are commonly connected to a power supply wiring layer 44 through corresponding contact holes 42 at an end face of the substrate, as shown in FIG. 12. A fixed potential is applied to the p+-type layer 40 through this power supply wiring layer 44.

The dRAM with the above structure has the following advantages. Each memory cell according to this embodiment comprises a vertical MOSFET formed on the side surface of the projection 14 and a MOS capacitor stacked thereon. In addition, the memory cells are formed on the two side walls of each projection 14. For this reason, a high-density and highly integrated dRAM can be obtained. Since the second electrodes 26 of the capacitors continuously formed along a single direction are used as bit lines, contact holes are not needed at the respective memory cell portions. This also facilitates high integration. Each MOS capacitor for accumulating data charge is separated from the substrate 10 by the n+-type layer 12 as the common drain region, thus preventing a soft error. Furthermore, when α-particles are irradiated into the p−-type layers 16 as the substrate regions or the channel regions of the MOSFETs, holes generated therein are absorbed in the p+-type layers 40 which have a −3 V potential, and electrons are absorbed in the n+-type layer 12 which has a 5 V potential. Thus, the dRAM of this embodiment is resitant to soft errors. Although the p−-type layers 16 as the substrate regions of the MOSFETs are separated from the substrate 10 by the n+-type layer 12, a potential thereof is fixed at −3 V by the p+-type layers 40. As a result, the p−-type layers 16 do not float, and a stable transistor operation may be obtained. Furthermore, since the gate electrodes 222a and 222b which serve as the word lines are arranged linearly along the side walls of the projections 14, they may be formed by RIE without forming mask. Therefore, a manufacturing process can be simplified, resulting in increased productivity.

Figure 15:
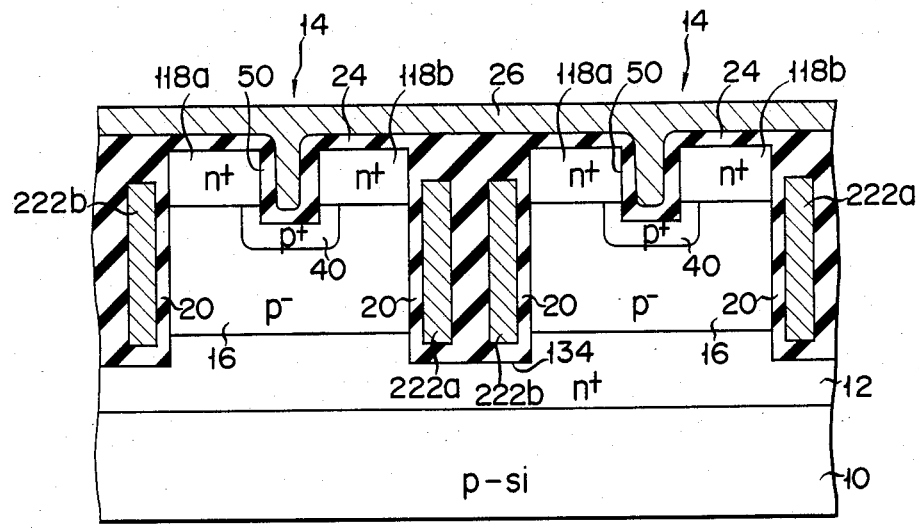
FIG. 15 is a sectional view of a MOS dynamic RAM according to an eighth embodiment of the present invention.

An eighth embodiment of a MOS dynamic RAM according to the present invention will be described with reference to FIG. 15. The same reference numerals denote the same parts as in the seventh embodiment and a detailed description thereof is omitted. In this embodiment, a groove 50 is formed between n+-type layers 118a and 118b which are formed on both sides of the surface of each projection 14. A second electrode 26 is formed on an inner surface of the groove 50 through a capacitor insulating film 24. With this structure, not only upper surfaces of the n+-type layers 118a and 118b, but also side surfaces thereof can be utilized as capacitors, thereby increasing a capacitance of the capacitor. Therefore, preferable memory characteristics can be obtained.

Figure 16:
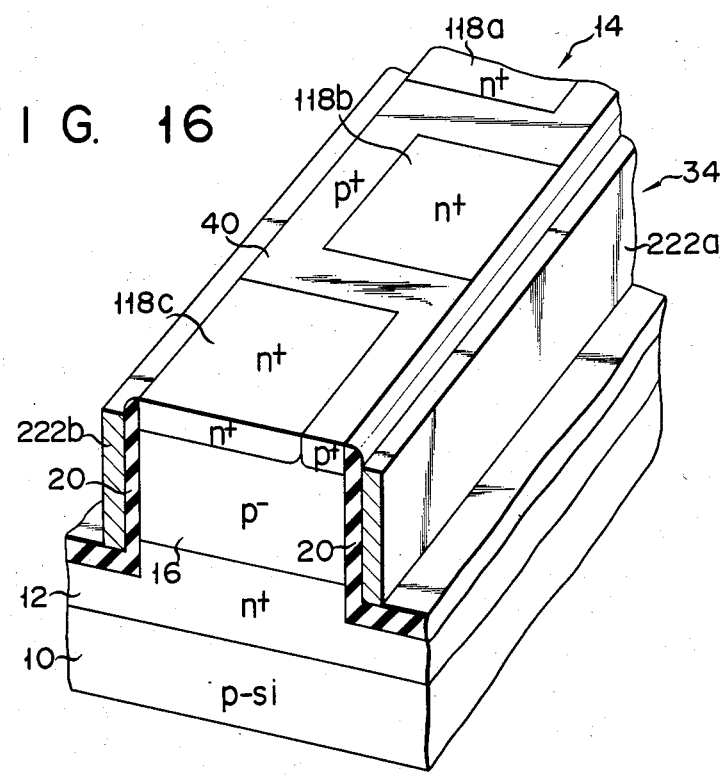
FIG. 16 is a perspective view of a MOS dynamic RAM according to a ninth embodiment of the present invention.

A ninth embodiment of a MOS dynamic RAM according to the present invention will be described with reference to FIG. 16. In the above embodiments, MOSFETs are symmetrically arranged on two side walls of each projection 14. However, in this embodiment, MOSFETs are alternately arranged in a staggered manner. Such a structure allows a large capacity of a capacitor within a limited stripe width.

Figure 17:
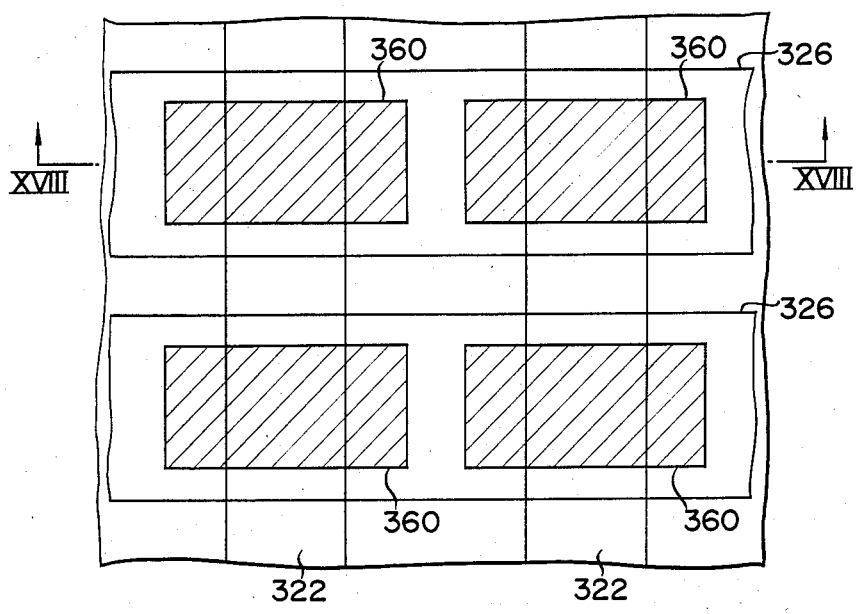
FIG. 17 is a plan view of a MOS dynamic RAM according to a tenth embodiment of the present invention.
Figure 18:
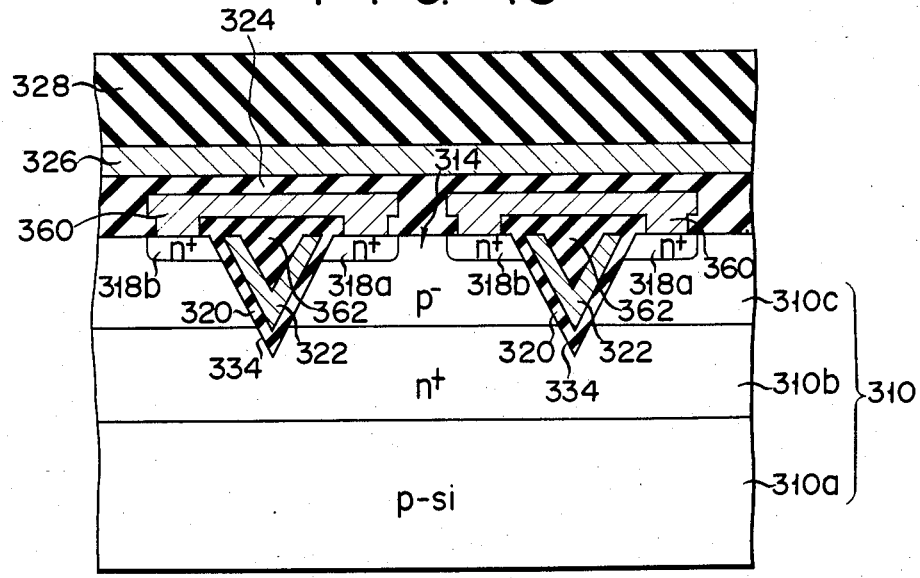
FIG. 18 is a sectional view taken along a line XVIII—XVIII of FIG. 17.

A tenth embodiment of a MOS dynamic RAM according to the present invention will be described with reference to FIGS. 17 and 18. In FIG. 17, hatched portions are MOS capacitor regions of the respective memory cells. As shown in FIG. 18, memory cells are integrated on a p$^-$-type substrate 310 comprising a three-layered structure in which an n$^+$-type layer 310$b$ and a p$^-$-type layer 310$c$ are sequentially formed on a p-type starting substrate 310$a$. The n$^+$-type layer 310$b$ is a common drain region of MOSFETs for all the memory cells. A p$^-$-type layer 310$c$ is a channel region. V-shaped grooves 334 which reach the n$^+$-type layer 310$b$ are formed in the substrate 310. Gate electrodes 322 of a first polycrystalline silicon film are formed on side walls of each groove 334 through a gate insulating film 320. N$^+$-type layers 318$a$ and 318$b$ as source regions of the MOSFETs are formed in upper portions of each projection 314. The n$^+$-type layers 318$a$ and 318$b$ are respectively arranged to sandwich the groove 34. The gate electrodes 322 are commonly provided for the memory cells aligned along the column direction so as to constitute the word lines. Each MOS capacitor comprises a first electrode 360 of a second polycrystalline silicon film stacked on the gate electrode 322 so as to be in contact with two source regions 318$a$ and 318$b$ of the MOSFET for each memory cell, and a second electrode 326 of a third polycrystalline silicon film formed on the first electrode 360 through an insulating film 324. The second electrodes 326 are arranged along the row direction so as to constitute the bit lines. Note that reference numerals 328 and 362 denote insulating interlayers.

Figure 19A:
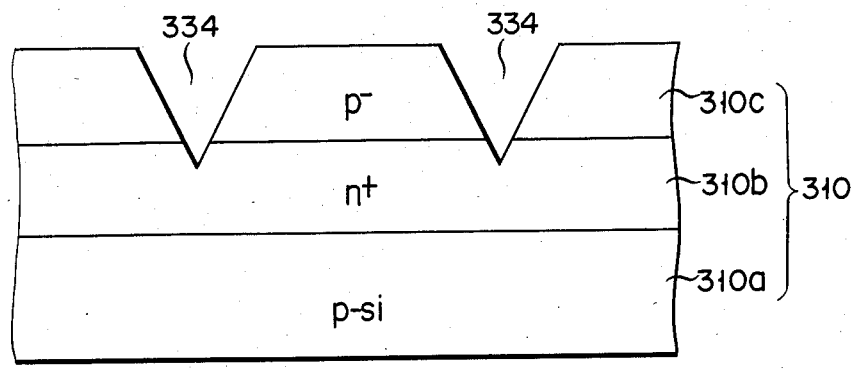
FIGS. 19A to 19C are sectional views for explaining a manufacturing method of the MOS dynamic RAM of FIG. 17.
Figure 19B:
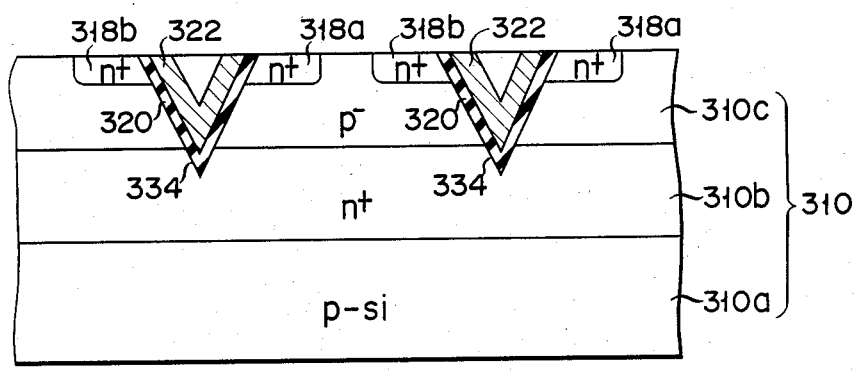
Figure 19C:
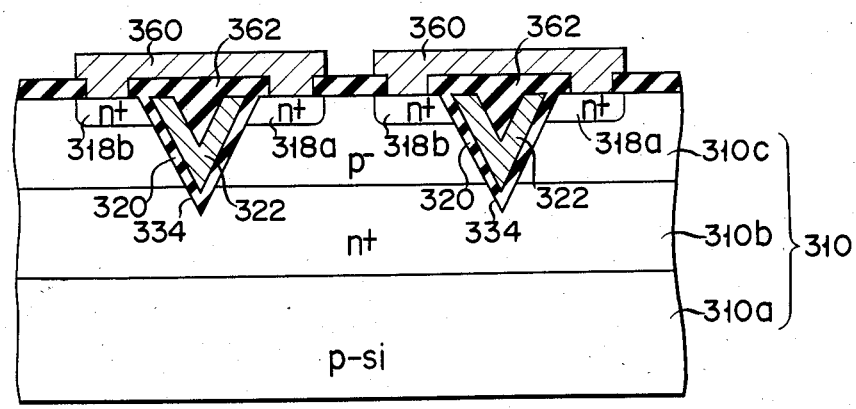

Next, a manufacturing process of the dRAM of the tenth embodiment will be described with reference to FIGS. 19A to 19C. FIGS. 19A to 19C are respectively sectional views corresponding to those of FIG. 18.

Figure 20:
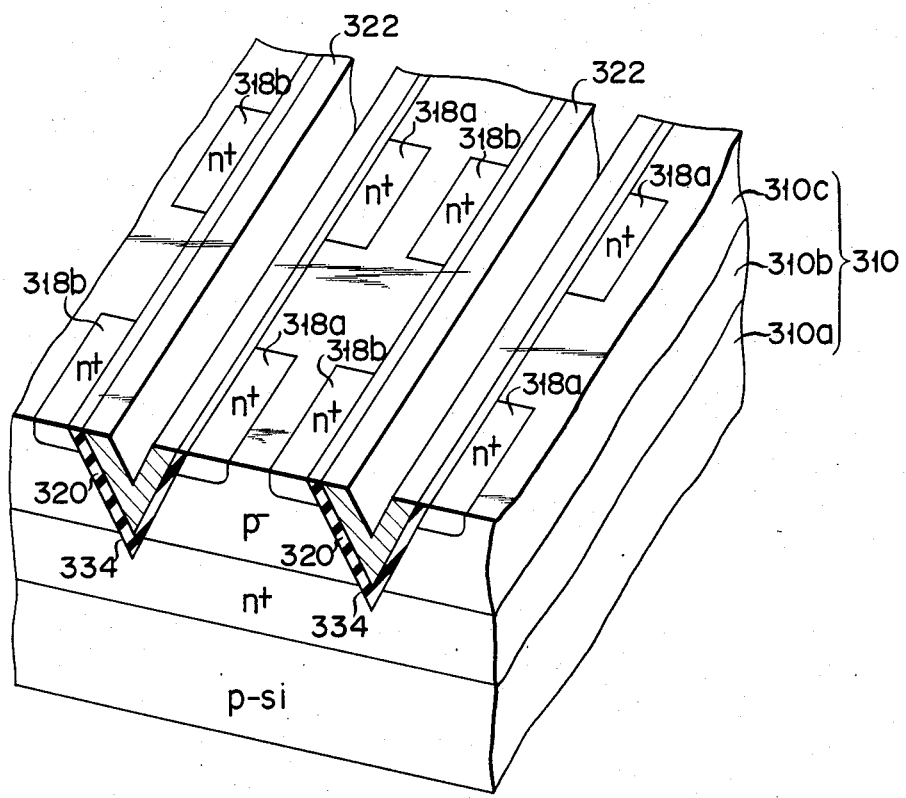
FIG. 20 is a perspective view of a semifinished MOS dynamic RAM shown in FIG. 19B.

As shown in FIG. 19A, phosphorus is diffused in the p-type starting substrate 310$a$ to a high concentration, thereby forming the n$^+$-type layer 310$b$ as a common drain region for all the memeory cells. The p$^-$-type layer 310$c$ containing boron of a low concentration is epitaxially grown on the resultant structure. An impurity concentration of the p$^-$-type layer 310$c$ is important for determining a threshold voltage of the MOSFET, and is set at, e.g., $1 \times 10^{17}$/cm$^3$. The substrate 310 with such a three-layered structure is etched by the PEP so as to form the V-shaped grooves 334 which reach the n$^+$-type layer 310$b$. For example, when a (100) substrate is used, the V-shaped grooves 334 can be easily formed by wet etching using KOH. Thereafter, as shown in FIG. 19B, for example, a thermal oxide film is formed on the resultant structure as the gate insulating film 320. The first polycrystalline silicon film is deposited on the thermal oxide film and is patterned to be buried in the V-shaped grooves 334, thereby forming the gate electrodes 322. The n$^+$-type layers 318$a$ and 318$b$ as source regions of the respective memory cells are formed by ion-implantation. FIG. 20 is a perspective view showing this state. The V-shaped grooves 334 are continuously formed on the substrate 310 along a single direction, and the gate electrodes 332 are continuously formed in the corresponding grooves 334. The gate electrodes 322 also serve as word lines. Thereafter, as shown in FIG. 19C, a CVD oxide film is formed as the interlayer insulating film 362. Contact holes are formed in the n$^+$-type layers 318$a$ and 318$b$ by the PEP, and the first electrodes 360 of the MOS capacitors are formed by the second polycrystalline silicon films. The first electrode 360 is formed in each memory cell so as to be in contact with the n$^+$-type layers 318$a$ and 318$b$ as the source regions which sandwich the groove 334. As shown in FIG. 18, a thermal oxide film of, e.g., 20 nm (200 Å) is formed on the first electrodes 360 as the capacitor insulating film 324. After forming the third polycrystalline silicon film, the second electrodes 326 serving as the bit lines are formed by patterning.

The dRAM according to this embodiment has the following advantages. Since vertical MOSFETs are provided in V-shaped grooves and MOS capacitors are formed thereon, the total area of the capacitor portion with respect to the total memory cell area can be large. Therefore, a large capacitance can be provided by a small memory cell area. In each memory cell according to the present invention, the capacitor for accumulating data charge is separated from the substrate 310 by a pn junction barrier. For this reason, the memory cells are resistant to soft errors. Since each MOSFET utilizes the opposing side walls of the groove 334 as a channel region, a channel width can be widened. Therefore, the gate insulating films need not be formed so thinly, and a variation in a threshold voltage due to hot electrons can be reduced. The manufacturing technique of the V-shaped groove 334 is well established, and therefore, productivity can be increased.

Figure 21:
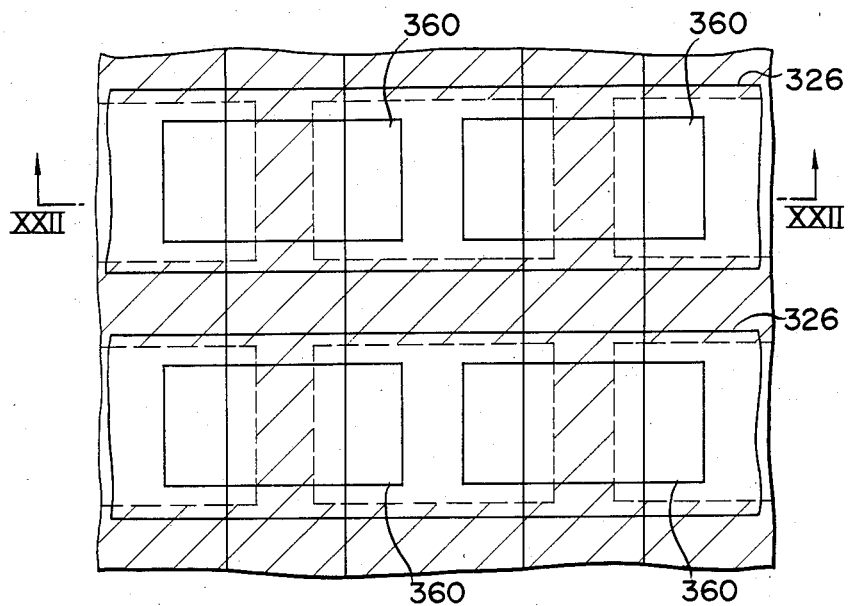
FIG. 21 is a plan view of a MOS dynamic RAM according to an eleventh embodiment of the present invention.
Figure 22:
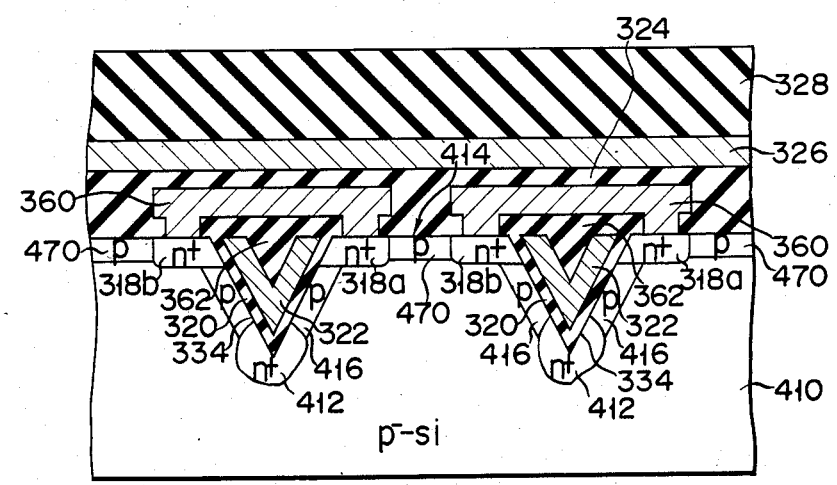
FIG. 22 is a sectional view taken along a line XXII—XXII of FIG. 21.

An eleventh embodiment of a MOS dynamic RAM according to the present invention will be described with reference to FIGS. 21 and 22.

In this embodiment, the dRAM of the present invention can be obtained without using an epitaxial substrate. The same reference numerals denote the same parts as those of the tenth embodiment, and a detailed description thereof is omitted. In this embodiment, after forming V-shaped grooves 334 in a p$^-$-type Si substrate 410, an n$^+$-type layer 412 as a drain region of a MOSFET Q is formed by ion-implantation. The n$^+$-type layer 412 is formed to be common to all the memory cells as indicated by hatched portions in FIG. 21. After forming the V-shaped grooves 334, a p-type impurity is ion-implanted in the overall surface of the resultant structure so as to form a p-type layer 416 for controlling a threshold voltage of the MOSFET. Note that a p-type layer 470 is also formed, at the same time, between the n$^+$-type source regions 318$a$ and 318$b$ formed in the upper surface of each projection 414. The other structures are the same as those of the tenth embodiment.

According to this embodiment, the step of forming an epitaxial layer can be omitted. An epitaxial layer has many defects. Therefore, since this embodiment does not use an epitaxial layer, it is advantageous in terms of reliability. The p-type layer 470 which is formed in the overall surface can be used as an element isolation layer.

Note that in this embodiment, the V-shaped grooves 334 are continuously formed along one direction. However, the V-shaped grooves 334 do not have to be continuously formed, but may be formed only in the respective memory cell regions.

Although the n$^+$-type layer, as the drain region of the MOSFETs, is commonly formed for all the memeory cell regions, it may be formed along the row or column direction in a stripe form and may be commonly connected with, e.g., an Al wiring layer in the periphery of a chip substrate.

Furthermore, it is allowed for a normal operating mode that the n+-type layer as the drain region of the MOSFETs is continuously formed along one direction and used as the bit line, and the second electrode of the capacitor is commonly provided on the overall surface and set at a fixed potential.

What is claimed is:

1. A MOS dynamic RAM constructed by integrated memory cells each having a MOSFET and a MOS capacitor comprising:
    a semiconductor substrate of a first conductivity type in which recesses and projections are periodically formed;
    a source region of a second conductivity type formed in an upper surface of each of said projections;
    a drain region of the second conductivity type formed in a bottom portion of each of said projections;
    a channel region of the first conductivity type sandwiched between said source and drain regions;
    a gate insulating film formed on a side wall of each of said projections between said source and drain region;
    a gate electrode formed on said gate insulating film, said MOSFET being constituted by said source, drain, and channel regions, said gate insulating film and said gate electrode;
    a first insulating film formed on said source region;
    a first electrode of said MOS capacitor formed on said first insulating film, said MOS capacitor being constituted by said source region, said first insulating film and said first electrode, said source region serving as a second electrode of said MOS capacitor, said gate electrode serving as a word line, and said first electrode of said MOS capacitor serving as a bit line.

2. A MOS dynamic RAM according to claim 1, wherein said channel region is separated from said semiconductor substrate by said drain region.

3. A MOS dynamic RAM according to claim 2, wherein said drain region is formed by a high impurity concentration layer which is common to all memory cells.

4. A MOS dynamic RAM according to claim 2, wherein a plurality of source regions of the second conductivity type are formed in the upper surface of each of said projections to be spaced apart from each other and to extend along the side walls of each of said projections; and
    said MOS dynamic RAM further comprises a high impurity concentration layer of the first conductivity type formed in the upper surface of each of said projections and between said source regions, said high impurity concentration layer being connected to said channel region and a fixed potential being applied thereto so as to prevent floating of said channel region.

5. A MOS dynamic RAM according to claim 1, wherein said drain region of the MOSFET is formed by a high impurity concentration layer which is common to all memory cells;
    said gate electrodes are formed by first polycrystalline silicon films and aligned along a column direction so as to constitute said word line;
    said source regions which serve as second electrodes of the MOS capacitors are independently formed for the corresponding memory cells; and
    said first electrodes of the MOS capacitor are formed by second polycrystalline silicon films and aligned along a row direction so as to constitute said bit line.

6. A MOS dynamic RAM according to claim 1, wherein said drain region of the MOSFET is formed by a high impurity concentration layer which is common to all memory cells;
    said gate electrodes are formed by first polycrystalline silicon films and aligned along a column direction so as to constitute said word line;
    said source regions which serve as said second electrodes of the MOS capacitors are independently formed for the corresponding memory cells; and
    said first electrodes of the MOS capacitors are independently formed for the corresponding memory cells, and said first electrodes are commonly connected to a metal wiring layer along a row direction so as to constitute said bit line.

7. A MOS dynamic RAM according to claim 1, wherein
    said source region is formed to cover the overall surface of each of said projections;
    said drain region is formed to cover the overall bottom portion of each of said projections; and
    said channel region is sandwiched by said source and drain regions and is separated from said semiconductor substrate through said drain region.

8. A MOS dynamic RAM according to claim 7, wherein said gate electrode includes
    a first gate electrode member formed on a first side wall of each of said projections through said gate insulating film; and
    a second gate electrode member formed on a second side wall of each of said projections through said gate insulating film;
    the same potential being supplied to said first and second gate electrode members.

9. A MOS dynamic RAM according to claim 7, wherein said first electrode of the MOS capacitor is provided on the upper and side surfaces of said source region through said first insulating film.

10. A MOS dynamic RAM according to claim 1, wherein
    a plurality of source regions of the second conductivity type are respectively formed in the upper surface of each of said projections so as to be spaced apart from each other and to extend along the side walls of each of said projections;
    said drain region of the MOSFET is formed by a layer common to all the memory cells;
    said gate electrode is formed along opposing side walls of two adjacent projections through said gate insulating film; and
    each MOSFET is constituted by a pair of source regions formed along opposing side walls of the two adjacent projections, said gate electrode and said drain region.

11. A MOS dynamic RAM according to claim 10, further comprising
    a high impurity concentration layer of the first conductivity type provided between said pair of source regions formed in the upper surface of each of said projections, said high impurity concentration layer being connected to said channel region and a fixed potential being applied thereto so as to prevent floating of said channel region.

12. A MOS dynamic RAM according to claim 10, further comprising
electrode means, which overlaps through a second insulating film said gate electrode corresponding to said pair of source regions formed along the opposing side walls of the two adjacent projections, for connecting said pair of source regions, said electrode means serving as a second electrode of the MOS capacitor.

13. A MOS dynamic RAM according to claim 12, further comprising
a high impurity concentration layer of the first conductivity type formed between said pair of source regions provided in the upper surface of each of said projections, said high impurity concentration layer being connected to said channel region and a fixed potential being applied thereto so as to prevent floating of said channel region.

14. A MOS dynamic RAM according to claim 1, wherein said recesses and said projections are periodically formed into stripe forms.

15. A MOS dynamic RAM according to claim 14, wherein
a plurality of source regions of the second conductivity type are formed in the upper surface of each of said projections so as to be spaced apart from each other and to extend along the side walls of each of said projections;
said drain region of the MOSFET is formed by a layer which is common to all the memory cells;
said gate electrode is provided along the opposing side walls of the two adjacent projections in a stripe form through said gate insulating film, said gate electrode being common to the MOSFETs formed along the side walls of each of the recesses; and
each MOSFET is constituted by a pair of source regions which are provided along the opposing side walls of the two adjacent projections, said gate electrode of the stripe form and said drain region.

16. A MOS dynamic RAM according to claim 15, further comprising
a high impurity concentration layer of the first conductivity type formed between said pair of source regions formed in the upper surface of each of said projections, said high impurity concentration layer being connected to said channel region and a fixed potential being applied thereto so as to prevent floating of said channel region.

17. A MOS dynamic RAM according to claim 15, further comprising
electrode means, which overlaps through a second insulating film said gate electrode corresponding to said pair of source regions formed along the opposing side walls of the two adjacent projections, for connecting said pair of source regions, said electrode means serving as a second electrode of the MOS capacitor.

18. A MOS dynamic RAM according to claim 17, further comprising
a high impurity concentration layer of the first conductivity type formed between said pair of source regions formed in the upper surface of each of said projections, said high impurity concentration layer being connected to said channel region and a fixed potential being applied thereto so as to prevent floating of said channel region.

19. A MOS dynamic RAM according to claim 17, wherein said recesses in the stripe forms are V-shaped grooves;
said gate electrodes of the MOSFETs formed in said V-shaped grooves are continuously arranged therein so as to form said word lines; and
said first electrodes of the MOS capacitors are continuously arranged along a direction perpendicular to said V-shaped grooves so as to form said bit lines.

20. A MOS dynamic RAM according to claim 14, wherein a plurality of source regions of the second conductivity type are formed in the upper surface of each of said projections so as to be spaced apart from each other and to extend along the side walls of each of said projections;
said drain region of the MOSFET is formed by a layer which is common to all the memory cells;
said gate electrodes of the MOSFETs are formed in a stripe form along both walls of each of said projections through said gate insulating film, each of said gate electrodes being common to the MOSFETs formed along one side wall of each of said projections; and
each MOSFET is constituted by said source region, said gate electrode which is formed on one side wall of the projection in which said source region is provided, and said drain region.

21. A MOS dynamic RAM according to claim 20, further comprising
a high impurity concentration layer of the first conductivity type formed between said pair of source regions formed in the upper surface of each of said projections, said high impurity concentration layer being connected to said channel region and a fixed potential being applied thereto so as to prevent floating of said channel region.

22. A MOS dynamic RAM according to claim 21, wherein
said gate electrode are continuously aligned along two side walls of said projections so as to constitute different word lines; and
said first electrodes of the MOS capacitors are continuously aligned along a direction perpendicular to said gate electrodes so as to constitute bit lines.

23. A MOS dynamic RAM according to claim 20, wherein a groove is formed between said source regions formed in the upper surface of each of said projections, said first electrode is formed on an inner surface of said groove through said first insulating film, so that side surfaces of said source regions serve as second electrodes of the MOS capacitors.

24. A MOS dynamic RAM according to claim 23, further comprising
a high impurity concentration layer formed in a bottom surface of said groove, said high impurity concentration layer being connected to said channel region and a fixed potential being applied thereto so as to prevent floating of said channel region.

25. A MOS dynamic RAM according to claim 1, wherein said recesses are V-shaped grooves.

26. A MOS dynamic RAM according to claim 25, wherein said drain region is formed in a bottom surface of each of said V-shaped grooves.

27. A MOS dynamic RAM according to claim 1, wherein said semiconductor substrate comprises a three-layered structure having
a starting substrate of the first conductivity type, a second conductivity type layer having a high impurity concentration formed on said starting substrate, and
a first conductivity type layer having a low impurity concentration formed on said second conductivity type layer;
said recesses are grooves having a depth from a surface of said first conductivity type layer to said second conductivity type layer;

said second conductivity type layer commonly serves as said drain region of each MOSFET for each memory cell;
said first conductivity type layer serves as said channel region of each MOSFET; and
said source region is formed in a surface of said first conductivity type layer on an upper portion of each of said projections.

* * * * *